(12) United States Patent
Kim

(10) Patent No.: US 6,844,589 B2
(45) Date of Patent: Jan. 18, 2005

(54) NON-VOLATILE SONOS MEMORY DEVICE AND METHOD FOR MANUFACTURING THE SAME

(75) Inventor: Seong-Gyun Kim, Sungnam-shi (KR)

(73) Assignee: Samsung Electronics, Co., LTD, Kyungki-do (KR)

( * ) Notice: Subject to any disclaimer, the term of this patent is extended or adjusted under 35 U.S.C. 154(b) by 0 days.

(21) Appl. No.: 10/728,514

(22) Filed: Dec. 5, 2003

(65) Prior Publication Data

US 2004/0155284 A1 Aug. 12, 2004

(30) Foreign Application Priority Data

Feb. 12, 2003 (KR) .............................. 10-2003-0008789

(51) Int. Cl.[7] .......................................... H01L 29/792
(52) U.S. Cl. ....................................... 257/324; 257/325
(58) Field of Search ................................. 257/324, 325

(56) References Cited

U.S. PATENT DOCUMENTS 6,472,706 B2 * 10/2002 Widdershoven et al. .... 257/314

* cited by examiner

Primary Examiner—David Nelms
Assistant Examiner—Tu-Tu Ho
(74) Attorney, Agent, or Firm—F. Chau & Associates, LLC

(57) ABSTRACT

A non-volatile SONOS memory device includes a semiconductor substrate having a source region and a drain region. A channel is formed between the source region and the drain region. A gate insulation layer including a nitride layer is formed over the channel, and a gate is formed over the gate insulation layer. The channel is a stepped channel including a top part, an inclined part and a bottom part. The nitride layer is formed over the inclined part and the bottom part, and the top part of the channel is adjacent to the source region and the bottom part of the channel is adjacent to the drain region.

18 Claims, 5 Drawing Sheets

NON-VOLATILE SONOS MEMORY DEVICE AND METHOD FOR MANUFACTURING THE SAME

BACKGROUND

1. Technical Field

The present disclosure relates to semiconductor memory devices, and more particularly, to non-volatile SONOS memory devices and a method for manufacturing the same.

2. Discussion of Related Art

A typical semiconductor memory device operable with a microprocessor is a volatile type memory device. A volatile memory device loses stored data when power to the device is cut off. A semiconductor memory device may also be a non-volatile type. A non-volatile memory device retains stored information even when power is cut off.

A conventional non-volatile memory device is a charge-trapping device. An example of such a non-volatile memory device is a floating gate memory device. The floating gate memory device is a kind of a field effect device in which electric charges are stored in an isolated conductive material referred to as a floating gate.

The floating gate is made of a conductive material, and is formed between a semiconductor substrate and a gate electrode. The floating gate holds charges by programming. Since the floating gate is conductive, if a portion of a tunneling oxide layer isolating the floating gate and the semiconductor substrate suffers from defects, all charges stored within the floating-gate may be lost. Therefore, the floating gate memory device needs to have thick tunnel oxide layer as compared with a floating trap memory device (as described later) to maintain reliability. In this case, a complex peripheral circuit is required due to the high operating voltage necessitated by the increased thickness of the tunneling oxide layer. Consequently, disadvantages of the floating gate memory device include limitation of high-integration and high-power dissipation.

Another example of the charge-trapping devices is a floating trap memory device that stores charges in an insulation bulk trap of the field effect device. The floating trap memory device performs programming by storing charges in a trap formed within an insulation charge storage layer formed between the gate electrode and the semiconductor substrate. Examples of floating trap memory devices are metal-nitride-oxide-semiconductor (MNOS); metal-alumina-oxide-semiconductor (MAOS); metal-alumina-semiconductor (MAS); silicon-oxide-nitride-oxide-semiconductor (SONOS) memory cell, etc.

SONOS memory devices, an example of which is disclosed in U.S. Pat. No. 5,387,534 entitled "METHOD OF FORMING AN ARRAY OF NON-VOLATILE SONOS MEMORY CELLS AND ARRAY OF NON-VOLATILE SONOS MEMORY CELLS", have been developed since the late 1960's.

Referring to FIG. 1, the non-volatile memory device according to the conventional art comprises source/drain regions 15 and 16, a gate insulation layer 17 including oxide-nitride-oxide layers (ONO) which are stacked sequentially on the semiconductor substrate 14, device isolation layers 19 and 20 and a gate electrode 18.

The non-volatile memory device operates by trapping electrons and holes in a nitride layer of the gate insulation layer 17. If a positive voltage is applied to the gate electrode 18, electrons tunnel from the semiconductor substrate to be captured in the trap within the nitride layer. As electrons are stored within the nitride layer of the gate insulation layer 17, a threshold voltage of the device rises to a programmed state.

To the contrary, if a negative voltage is applied to the gate electrode 18, electrons captured at the trap within the nitride layer of the gate insulation layer 22 tunnel to flow into the semiconductor substrate 14. At this time, holes of the semiconductor substrate 14 tunnel to be captured in the trap within the nitride layer. Accordingly, the threshold voltage of the device decreases to an erase state.

The non-volatile SONOS memory device can use a thinner gate insulation as compared to that used with the floating gate memory device because charges are stored in a deep level trap. In addition, the non-volatile SONOS memory device has a simple structure as compared with the floating gate memory device, so that the fabrication process is simple and high-integration is easily obtained.

In the conventional art, a high electrical field is necessary to generate hot carrier and to inject hot carrier into a nitride layer within the gate insulation layer when programming. For this reason, programming is achieved when the source/drain voltages are established over 7 voltages. Under this condition, current consumption is several hundreds $\mu A$. Accordingly, disadvantages of the conventional SONOS memory device include low pumping efficiency and excessive dimensions of the pumping circuit due to high voltage and excessive electric current dissipation during programming.

SUMMARY OF THE INVENTION

A non-volatile memory device according to an embodiment of the present invention includes a semiconductor substrate having source/drain regions. A channel is formed between the source region and the drain region. The channel is a stepped channel having at least a top part, an inclined part and a bottom part. The top part is adjacent to the source region and the bottom part is adjacent to the drain region. A gate insulation layer including a nitride layer is formed over the channel. The nitride layer is formed over both the inclined part and bottom part. A gate electrode is formed over the gate insulation layer. Electrons are implanted into the nitride layer through the inclined part of the channel.

In at least one embodiment of the invention, the nitride layer is inserted in an oxide layer.

A method of manufacturing a non-volatile memory device according to an embodiment of the invention includes forming a stepped pattern in a substrate, the stepped pattern including a top part, an inclined part and a bottom part. An ONO insulation layer is formed over the stepped pattern on the semiconductor substrate. A conductive layer is formed over the ONO insulation layer, and the ONO insulation layer and the conductive layer are patterned to form a gate insulation layer and a gate electrode. A source region is formed in the substrate at one side of the gate electrode and a drain region is formed in the substrate at another side of the gate electrode.

In at least one embodiment of the invention, the gate insulation layer includes a nitride layer, and the nitride layer is inserted in an oxide layer. The nitride layer is disposed over only the top and inclined parts of the channel.

In at least one embodiment of the invention, a step of forming the ONO insulation layer includes forming a first oxide layer, a nitride layer and a second oxide layer sequentially on the semiconductor substrate. The second oxide layer and the nitride layer formed on the top part is removed.

The first oxide layer remaining on the top part and the second oxide layer remaining on the inclined and bottom parts are removed. A third oxide layer is formed over the semiconductor substrate to cover the nitride layer and the first oxide layer remaining on the inclined part and the bottom part, and the semiconductor substrate is annealed.

In at least one embodiment of the invention, the step of removing the second oxide layer and the nitride layer includes forming a photoresist pattern on the second oxide layer to cover only the inclined and bottom parts, and etching the second oxide layer and the nitride layer that are formed on the top part using the photoresist pattern as a mask.

In at least one embodiment of the invention, the step of removing the first oxide layer and the second oxide layer includes a wet etching process.

A method of fabricating a non-volatile memory device according to another embodiment of the present invention includes forming a stepped pattern in a semiconductor substrate, the stepped pattern including a top part, an inclined part and a bottom part A first oxide layer, a nitride layer and a second oxide layer are sequentially formed over the stepped pattern of the semiconductor substrate. The second oxide layer and the nitride layer formed over the top part is removed. The first oxide layer remaining on the top part and the second oxide layer remaining on the inclined and bottom parts are removed. A third oxide layer is formed over the semiconductor substrate to cover the nitride layer and the first oxide layer remaining on the inclined and bottom parts. The semiconductor substrate is annealed, and a conductive layer is formed over the third oxide layer. A gate insulation layer and a gate electrode are formed by patterning the conductive layer, the third oxide layer and the first oxide layer. A source region is formed in the substrate at one side of the gate electrode and a drain region is formed in the substrate at another side of the gate electrode.

BRIEF DESCRIPTION OF THE DRAWINGS

Embodiments of the invention will be described with reference to the accompanying drawings in which.

DESCRIPTION OF PREFERRED EMBODIMENTS

Figure 1:
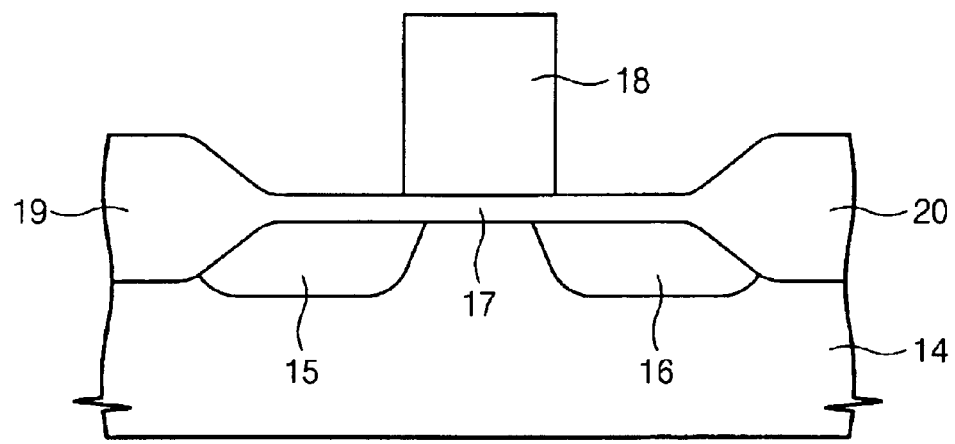
FIG. 1 is a cross-sectional view of a conventional non-volatile SONOS memory device.

Preferred embodiments of the invention will now be described more fully hereinafter with reference to the accompanying drawings. In the drawings, the thickness of the layers and regions are exaggerated for clarity. Like numbers refer to like elements throughout the specification.

Figure 2:
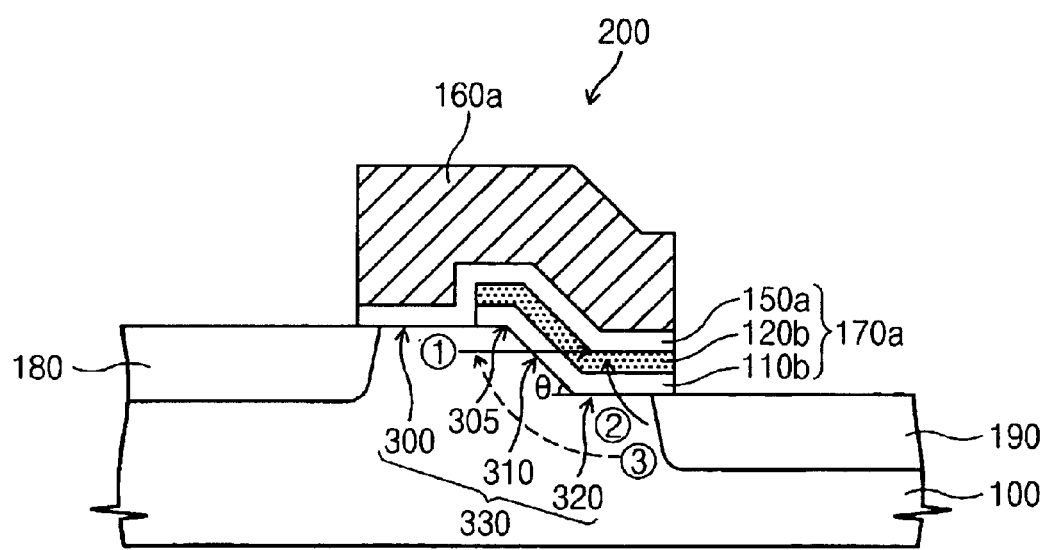
FIG. 2 is a cross-sectional view of the non-volatile SONOS memory device according to an embodiment of the present invention.

FIG. 2 is a cross-sectional view of a non-volatile SONOS memory device according to an embodiment of the present invention, and FIG. 3 through FIG. 12 are cross-sectional views showing a method for manufacturing a non-volatile memory device according to an embodiment of the present invention.

Referring to FIG. 2, a non-volatile SONOS memory device 200 according to an embodiment of the invention includes a transistor formed on a semiconductor substrate 100. The semiconductor substrate 100 can be made of any suitable semiconductor material, such as, for example, silicon. The transistor includes a source region 180, a drain region 190, a channel 330 formed on the surface of the semiconductor substrate 100 between the source region 180 and the drain region 190, and a gate insulation layer 170a and a gate electrode 160a formed on the channel 330.

The channel 330 has a stepped structure including a top part 300, an inclined part 310 and a bottom part 320. The top part 300 of the channel 330 is adjacent to the source region 180 and the bottom part 320 of channel 330 is adjacent to the drain region 190. The inclined part 310 is inclined by an angle Θ measured from the horizontal substrate 100. If the angle Θ of the inclined part 310 is too small, the length of the channel 330 becomes too long, thus making high-integration of the device difficult to achieve. Accordingly, the angle Θ of the inclined part 310 is preferably approximately over 30 degrees.

The gate insulation layer 170a includes a nitride layer 120b disposed between oxide layers 110b and 150a and has a stepped form that follows the stepped structure of the channel 330.

In an exemplary embodiment of the invention, the nitride layer 120b is not formed on the top part 300 of the channel 330, but is instead formed on only the inclined part 310 and the bottom part 320. As a result, erase characteristics of the transistor 200 may be improved (as will be described in further detail later). The oxide layer 150a is formed on the entire top part 300, inclined part 310 and bottom part 320 of the channel 330.

The gate electrode 160a is formed of conductive material, such as polysilicon, and performs switching. The gate electrode 160a is electrically isolated from the semiconductor substrate 100 by the oxide layers 110b and 150a.

When voltage of the gate electrode 160a is made higher than a threshold voltage of the top part 300 at the channel 330 by applying proper voltage to the gate electrode 160a, electrons move from the source region 180 to the drain region 190. Movement of electrons in the horizontal direction is accelerated depending on the horizontal electric field generated by a potential difference.

When electrons encounter edge 305 of the channel 330, they do not need to change their momentum (or movement) from a horizontal direction to a vertical direction to penetrate the oxide layer 110b. Thus, the edge 305 of the channel 330 acts as another injection point of electrons. If the energy of electrons is higher than the energy barrier of the oxide layer (e.g., the energy barrier of silicon is 3 eV) and the potential of the gate electrode 160a is higher than the potential of the edge part 305, electrons pass through the inclined part 310 of the channel 330 and the oxide layer 110b. The electrons are then caught in the nitride layer 120b and programming is performed. Momentum of electrons is not changed from a horizontal direction to a vertical direction and electrons move in a horizontal direction ① from the source region 180 to the drain region 190.

An erasing operation of the device 200 is performed by movement of holes from the drain region 190 into the nitride layer 120b. The erasing operation is performed effectively at the region not far from the drain region 190, but, because holes have low mobility, the erasing operation is not properly performed at the region far from the drain region 190.

Accordingly, the nitride layer 120b may be positioned adjacent to the drain region 190, taking into consideration to which direction the holes move more smoothly. In the present embodiment of the invention, the holes move more smoothly in direction ② than in direction ③. Thus, the nitride layer 120b may be formed on only the inclined part 310 and the bottom part 320 of the channel 330, thereby improving the erasing characteristics of the device 200.

A method of manufacturing a non-volatile SONOS memory device according to an exemplary embodiment of the present invention will be described referring to FIG. 3 through FIG. 12.

Figure 3:
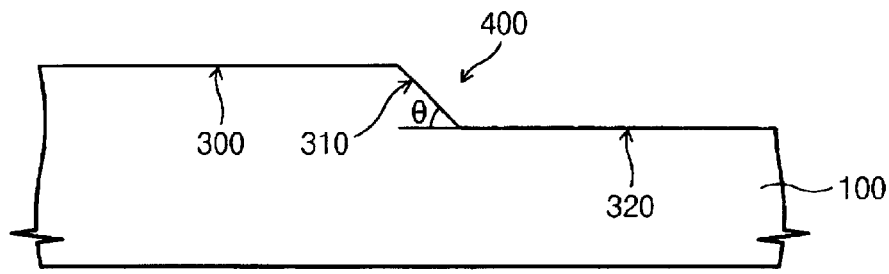
FIG. 3 through FIG. 12 are cross-sectional views illustrating a method for manufacturing a non-volatile memory device according to an embodiment of the present invention.
Figure 4:
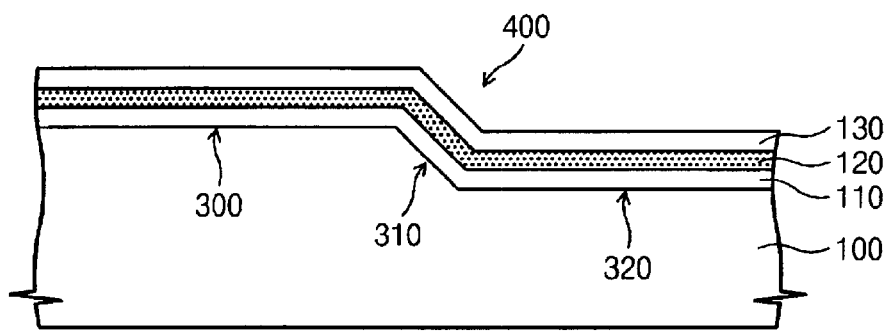

As shown in FIG. 3, a method of manufacturing a non-volatile SONOS memory device according to an exemplary embodiment of the invention includes a step of preparing a semiconductor substrate 100 made of any suitable conductive chemical element such as silicon. The stepped pattern 400, including the top part 300, the inclined part 310 and the bottom part 320, is formed by removing a portion of the semiconductor substrate 100. The inclined part 310 is inclined by an angle Θ measured from the horizontal substrate 100. The angle Θ is preferably greater than 30 degrees. As shown in FIG. 4, the first oxide layer 110, the nitride layer 120 and the second oxide layer 130 are sequentially formed to conform to the stepped pattern 400 on the semiconductor substrate 100. For example, the first oxide layer 150 such as a silicon oxide layer ($SiO_2$) is formed by oxidizing the semiconductor substrate 100, the nitride layer 120 such as a silicon nitride layer ($Si_3N_4$) layer is formed on the first oxide layer 110, and the second oxide layer 120 is formed on the nitride layer 120 by chemical vapor deposition.

Figure 5:
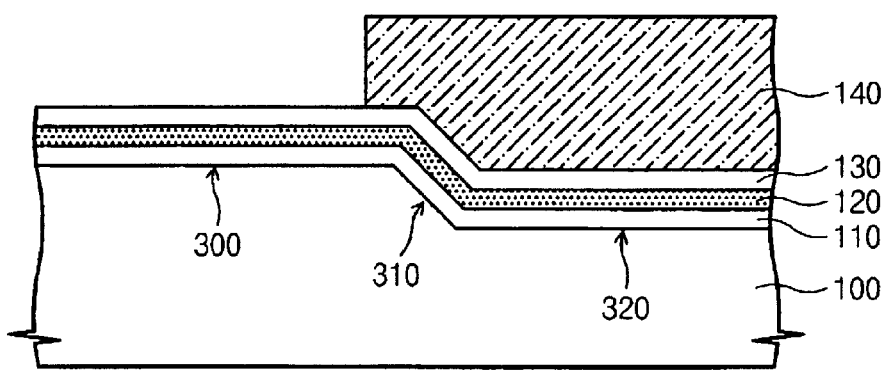

As shown in FIG. 5, a photoresist pattern 140 is formed on the second oxide layer 130 by coating and exposing a photoresist layer. In the present embodiment of the invention, the photoresist pattern 140 covers only the inclined part 310 and the bottom part 320.

Figure 6:
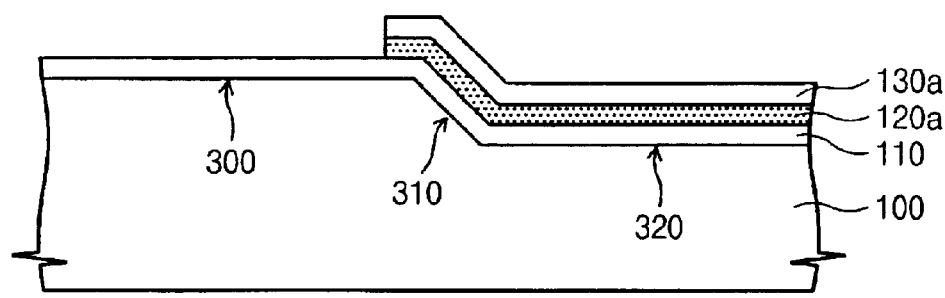

As shown in FIG. 6, the second oxide layer 130 is removed selectively by an etching process using the photoresist pattern 400 as a mask. Consequently, only the first oxide layer 110 remains on the top part 300, and the first oxide layer 110, the nitride layer 120a and the second oxide layer 130a remain on the inclined and bottom parts 310 and 320.

Figure 7:
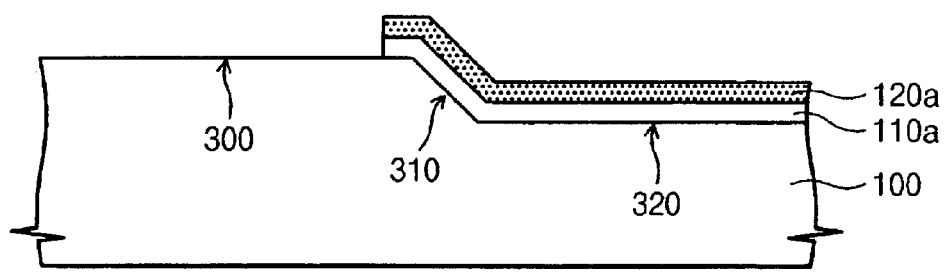

As shown in FIG. 7, the first oxide layer 110 on the top part 300 and the second oxide layer 130a on the inclined and bottom parts 310 and 320 are removed selectively by an etching process. The first oxide layer 110a and the nitride layer 120a remain on only the inclined and bottom part 310 and 320 of the semiconductor substrate 100.

The etching process used to remove the oxide layers 110a and 130a may be a wet etching process rather than a dry etching process to prevent etching damage to the semiconductor substrate 100. The wet etching process preferably has excellent etch selectivity between the oxide layer and the nitride layer to prevent undesirable damage to the nitride layer 120a.

Figure 8:
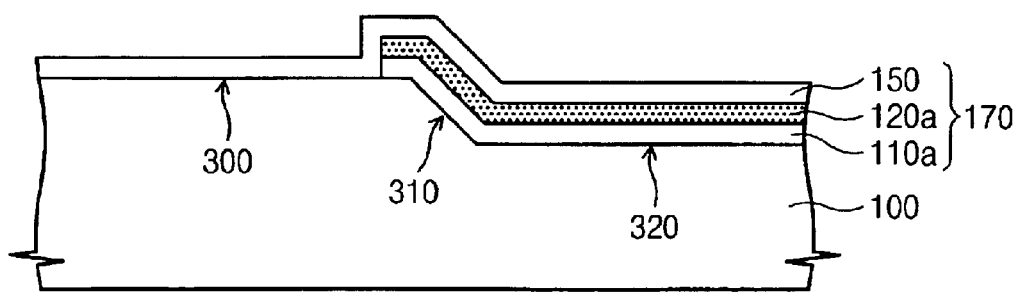

As shown in FIG. 8, a third oxide layer 150 layer is formed by depositing a CVD oxide layer on the entire surface of the semiconductor substrate 100 to cover the residual nitride layer 120a and first oxide layer 110a on the inclined part 310 and bottom part 320. The third oxide layer 150 is hardened by a thermal process. If there is a need to form the first oxide layer 110a thicker than the third oxide layer 150, a thermal oxidation process may be performed instead of a thermal process to harden the third oxide layer 150.

The thermal process leads to the formation of a stepped ONO insulation layer 170 having a structure including the first oxide layer 110a, the third oxide layer 150 and the nitride layer 120a interposed between the first oxide layer 110a and the third oxide layer 150.

Figure 9:
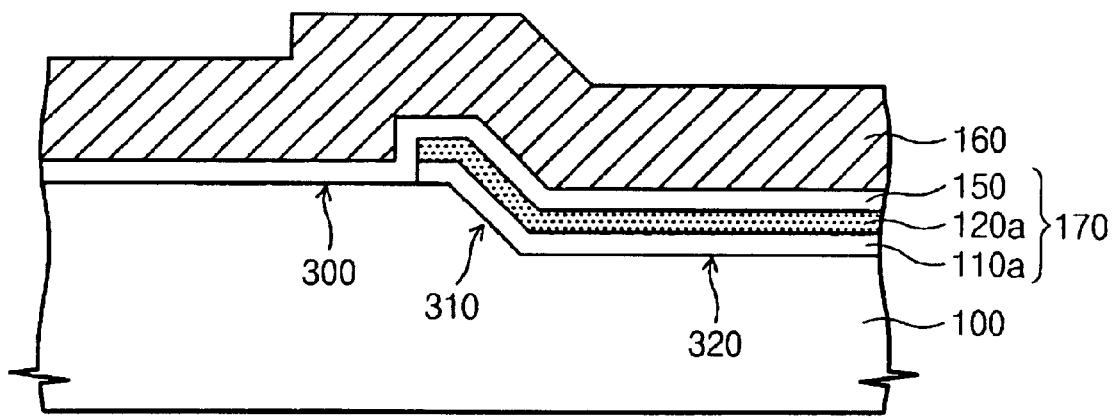

As shown in FIG. 9, a conductive layer 160 is formed on the ONO insulation layer 170. The conductive layer 160 can be made of any suitable conductive material, such as, for example, polysilicon or the like, and can be deposited by, for example, physical vapor deposition.

Figure 10:
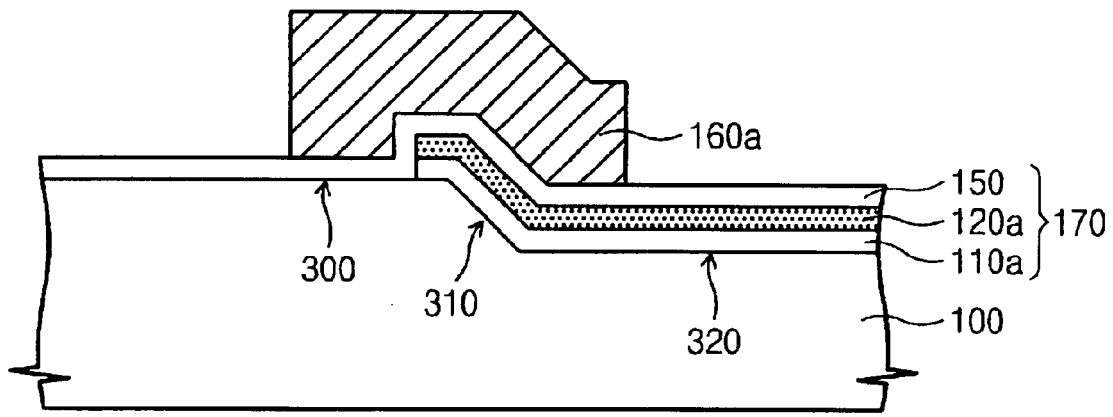

As shown in FIG. 10, the gate electrode 160a is formed by patterning a portion of the conductive layer 160. The conductive layer 160 is preferably patterned by dry etching with plasma.

Figure 11:
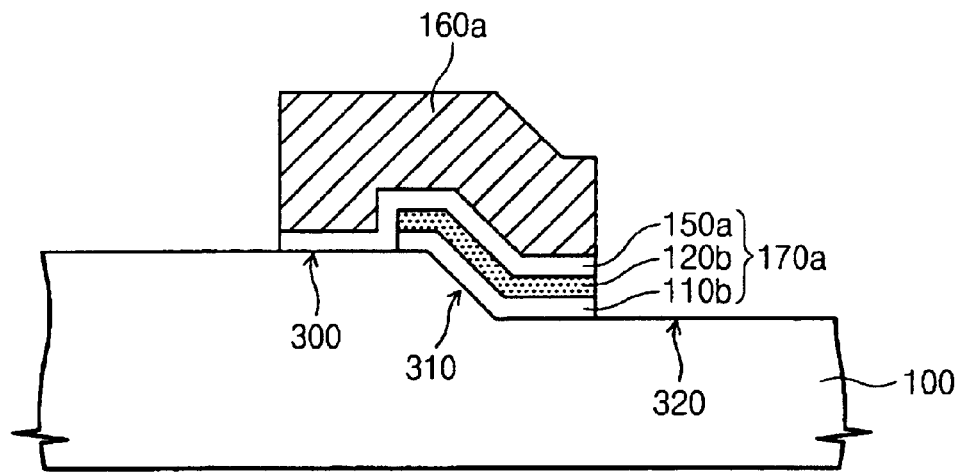

As shown in FIG. 11, the gate insulation 170a is formed by patterning the ONO insulation layer 170. The ONO insulation layer 170 is preferably patterned by an etching process using the gate electrode 160a as a mask. The gate insulation 170a is formed with a stepped structure including the first oxide layer 110b, the third oxide layer 150a and the nitride layer 120b interposed between the first oxide layer 110b and the third oxide layer 150a. The nitride layer 120b is disposed on only the inclined and bottom parts 310 and 320.

Figure 12:
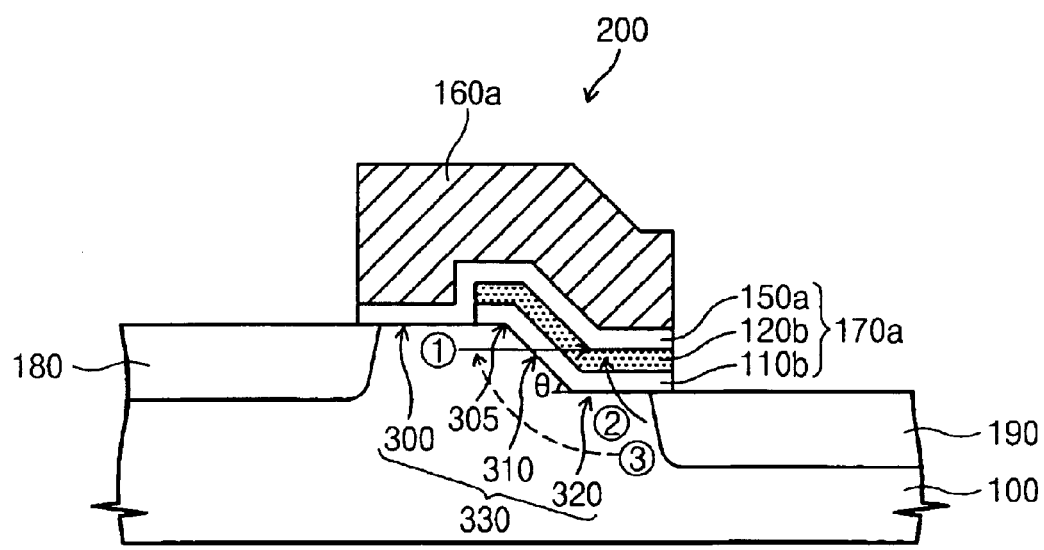

As shown in FIG. 12, the source region 180 and the drain region 190 are formed in the semiconductor substrate 100 adjacent to the gate electrode 160a by an impurity ion implantation process using the gate electrode 160a as a mask.

The source region 180 is formed adjacent to the top part 300 and the drain region 190 is formed adjacent to the bottom part 320.

The surface of the semiconductor substrate 100 between the source region 180 and the drain region 190 defines a channel 330. The channel 330 has a stepped structure including the top part 300, the inclined part 310 and the bottom part 320.

In a non-volatile SONOS memory device and a method of fabricating the same according to exemplary embodiments of the present invention, the shape of the gate insulation layer is stepped locally. The stepped gate insulation can reduce the programming voltage being applied to the gate from 7 voltages to approximately 3 voltages because the charge storage layer, that is, the nitride layer is disposed in a relatively low position.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A non-volatile SONOS memory device comprising:
 a semiconductor substrate including a source region and a drain region;
 a channel formed in the semiconductor substrate between the source region and the drain region, the channel being a stepped channel comprising at least a top part, an inclined part and a bottom part, the top part being adjacent to the source region and the bottom part being adjacent to the drain region;
 a gate insulation layer including a nitride layer formed over the channel, the nitride layer being formed over both the inclined part and the bottom part; and
 a gate electrode formed over the gate insulation layer,
 electrons being injected into the nitride layer through the inclined part of the channel.

2. The non-volatile SONOS memory device of claim 1, wherein the nitride layer is inserted in an oxide layer.

3. The non-volatile SONOS memory device as defined by claim 2, wherein the oxide layer comprises at least a first oxide layer and second oxide layer, and the nitride layer is disposed between the first oxide layer and the second oxide layer.

4. The non-volatile SONOS memory device as defined by claim 3, wherein the first oxide layer and the nitride layer are formed only over the bottom part and the inclined part of the channel.

5. The non-volatile SONOS memory device as defined by claim 1, wherein the inclined part of the channel is inclined by at least an angle of 30 degrees.

6. A method of fabricating a non-volatile SONOS memory device comprising the steps of:
   forming a stepped pattern in a semiconductor substrate, the stepped pattern comprising a top part, an inclined part, and a bottom part;
   forming an ONO insulation layer over the stepped pattern on the semiconductor substrate;
   forming a conductive layer over the ONO insulation layer;
   patterning the ONO insulation layer and the conductive layer to form a gate insulation layer and a gate electrode; and
   forming a source region in the substrate at one side of the gate electrode and a drain region in the substrate at another side of the gate electrode.

7. The method of claim 6, wherein the gate insulation layer comprises a nitride layer, and the nitride layer is inserted in an oxide layer.

8. The method of claim 7, wherein the nitride layer is disposed over only the inclined and bottom parts of the channel.

9. The method of claim 6, wherein a step of forming the ONO insulation layer comprises the steps of:
   forming a first oxide layer, a nitride layer and a second oxide layer sequentially on the semiconductor substrate;
   removing the second oxide layer and the nitride layer formed on the top part;
   removing the first oxide layer remaining on the top part and the second oxide layer remaining on the inclined part and the bottom part;
   forming a third oxide layer over the semiconductor substrate, thereby covering the nitride layer and the first oxide layer remaining on the inclined part and the bottom part; and
   annealing the semiconductor substrate.

10. The method of claim 9, wherein a step of removing the nitride layer and the second oxide layer formed on the top part comprises the steps of:
    forming a photoresist pattern on the second oxide layer to cover only the inclined and bottom parts;
    etching the nitride layer and the second oxide layer formed on the top part using the photoresist pattern as a mask; and
    removing the photoresist pattern.

11. The method of claim 9, wherein the step of removing the first and second oxide layer layers comprises a wet etching process.

12. The method of claim 9, wherein the third oxide layer is a CVD oxide layer.

13. The method of claim 6, wherein the source region is adjacent to the top part and the drain region is adjacent to the bottom part.

14. A method of fabricating a non-volatile SONOS memory device comprising the steps of:
    forming a stepped pattern in a semiconductor substrate, the stepped pattern comprising a top part, an inclined part, and a bottom part;
    forming a first oxide layer layer, a nitride layer and a second oxide layer sequentially over the stepped pattern of the semiconductor substrate;
    removing the nitride layer and the second oxide layer formed over the top part;
    removing the first oxide layer remaining on the top part and the second oxide layer remaining on the inclined and bottom parts;
    forming a third oxide layer over the semiconductor substrate, thereby covering the first oxide layer and the nitride layer remaining on the inclined and bottom parts;
    annealing the semiconductor substrate;
    forming a conductive layer on the third oxide layer;
    patterning the conductive layer, the third oxide layer, the nitride layer, and the first oxide layer to form a gate insulation layer and a gate electrode; and
    forming a source region in the substrate at one side of the gate electrode and a drain region in the substrate at another side of the gate electrode.

15. The method of claim 14, wherein a step of removing the nitride layer and the second oxide layer formed on the top part comprises the steps of:
    forming a photoresist pattern over the second oxide layer to cover only the inclined and bottom parts;
    etching the nitride layer and the second oxide layer formed over the top part using the photoresist pattern as a mask; and
    removing the photoresist pattern.

16. The method of claim 14, wherein the step of removing the first oxide layer and the second oxide layer comprises a wet etching process.

17. The method of claim 14, wherein the third oxide layer is a CVD oxide layer.

18. The method of claim 14, wherein the source region is adjacent to the top part and the drain region is adjacent to the bottom part.

* * * * *